United States Patent [19]

Göckler

[11] Patent Number: 4,896,320
[45] Date of Patent: Jan. 23, 1990

[54] FILTER BANK FOR FREQUENCY DEMULTIPLEXING IN MULTIPLE CHANNELS

[76] Inventor: Heinz Göckler, Elbinger Strasse 52, D-7150 Backnang, Fed. Rep. of Germany

[21] Appl. No.: 193,782

[22] Filed: May 13, 1988

[30] Foreign Application Priority Data

May 14, 1987 [DE] Fed. Rep. of Germany ....... 3716018

[51] Int. Cl.$^4$ ............................................. H04J 1/08
[52] U.S. Cl. ................................ 370/123; 364/724.1; 364/724.13; 364/724.16
[58] Field of Search ................................ 370/123, 70; 364/724.13, 724.01

[56] References Cited

U.S. PATENT DOCUMENTS

| 4,237,551 | 12/1980 | Narashima | 370/50 |
| 4,300,229 | 11/1981 | Hirosaki | 370/70 |
| 4,578,790 | 3/1986 | Molo et al. | 370/70 |
| 4,706,239 | 11/1987 | Ito et al. | 370/123 |

OTHER PUBLICATIONS

Del Rio, Enrico and Emiliani, P. L., "An Analytic Signal Approach for Transmultiplexers: Theory and Design," IEEE Transactions on Communications, vol. COM-30, No. 7, Jul. 1982, p. 1623-1628.
Crochiere, R. E. and Rabiner, L. R., Multirate Digital Processing, Chs. 5 & 6, pp. 193-269.
Bellanger, M. G., Daguet, J. L. and Lepagnol, G. P., "Inter-Extrapolation, and Reduction of Computation Speed in Digital Filters," IEEE Transactions on Acoustics, Speech, and Signal Processing, vol. ASSP-22, No. 4, Aug. 1974, pp. 231-235.

Primary Examiner—Douglas W. Olms
Assistant Examiner—Min Jung

[57] ABSTRACT

A filter bank for frequency demultiplexing or multiplexing, respectively, of L channel signals. The filter bank is composed of L transversal filters (non-recursive filters, that is filters having an impulse response of finite duration having complex valued coefficients, for real value input signals and complex value output signals and vice versa and a sampling rate at the output which is reduced or increased, respectively, by a factor of M. At least one of the L filters is realized by cascading at least two filters each having complex valued coefficients; in each one of these filters $F_1, \ldots F_q, \ldots F_Q$, the sampling rate is reduced or increased, respectively, by a factor of $M_1 > 1$ and $$\prod_{q=1}^{Q} M_q = M;$$

In the case of demultiplexing, the filter bank is arranged so that the input filters of each cascade receives a real value input signal and puts out a complex value output signal. The other filters of each cascade each receive a complex value input signal and put out a complex value output signal. In the case of multiplexing, the filter bank is arranged so that the first Q-1 filters of each cascade receive a complex value input signal and put out a complex value output signal and the output filter of each cascade receive a complex value input signal and put out a real value output signal.

14 Claims, 3 Drawing Sheets

FILTER BANK FOR FREQUENCY DEMULTIPLEXING IN MULTIPLE CHANNELS

BACKGROUND OF THE INVENTION

The present invention relates to a filter bank for frequency demultiplexing of channel signals, and more particularly to such a filter bank for frequency demultiplexing or multiplexing of a number of channel signals, the filter bank being composed of the same number of transversal filters (non-recursive filters, filters having a impulse response of finite duration) having complex valued coefficients, respectively for either real value input signals and complex value output signals in the case of demultiplexing or complex value input signals and real value output signals in the case of multiplexing, and a sampling rate at the output which is reduced in the case of demultiplexing or increased in the case of multiplexing, by a given factor.

Such a filter bank is disclosed in the article by Del Re and Emiliani, entitled "An Analytic Signal Approach For Transmultiplexers: Theory and Design", in IEEE Transactions on Communications, Vol. Com-30, No. 7, July 1982, pages 1623 et seq.

Such a filter bank for multiplexing or demultiplexing individual FDM channels is used primarily in so-called transmultiplexers which serve to convert FDM (frequency division multiplex) to TDM (time division multiplex) and vice versa and are used, for example, in satellite communications or in telephone networks. Particularly in satellite communications it is of the utmost necessity to take care that the useful computational load is as small as possible.

SUMMARY OF THE INVENTION

It is therefore an object of the present invention to provide a filter bank of the above-mentioned type in which the required circuitry is reduced or with which improved system characteristics can be realized with an unchanged amount of circuitry.

This is accomplished by providing such filter banks wherein for respectively demultiplexing or multiplexing L channel signals with L filters and a sampling rate respectively reduced or increased by a factor of M, the filter bank is composed of L transversal filters (non-recursive filters, filters having a impulse response of finite duration) having complex valued coefficients, for real value input signals and complex value output signals and vice versa and a sampling rate at the output which is reduced or increased, respectively, by a factor of M. At least one of the L filters is realized by cascading at least two filters each having complex valued coefficients; in each one of these filters $F_1, \ldots F_q, \ldots F_Q$, the sampling rate is reduced or increased, respectively, by a factor of $M_q > 1$ and $$\pi_{q=1}^{Q} M_q = M;$$

In the case of demultiplexing, the filter bank is arranged so that the input filters of each cascade receives a real value input signal and puts out a complex value output signal. The other filters of each cascade each receive a complex value input signal and put out a complex value output signal. In the case of multiplexing, the filter bank is arranged so that the first Q-1 filters of each cascade receive a complex value input signal and put out a complex value output signal and the output filter of each cascade receives a complex value input signal and puts out a real value output signal.

The filter bank according to the invention has the advantage of requiring a smaller amount of circuitry or, with the same amount of circuitry, providing better system characteristics.

Although the book by Crochiere and Rabiner entitled "Multirate Digital Signal Processing", Prentice Hall, 1983, discloses multi-stage filter solutions, these relate only to filters having real value coefficients.

BRIEF DESCRIPTION OF THE DRAWINGS

These and other features and advantages of the invention will be more completely understood from the following description of the preferred embodiments and the accompanying drawings, in which.

DESCRIPTION OF THE PREFERRED EMBODIMENTS

Figure 1:
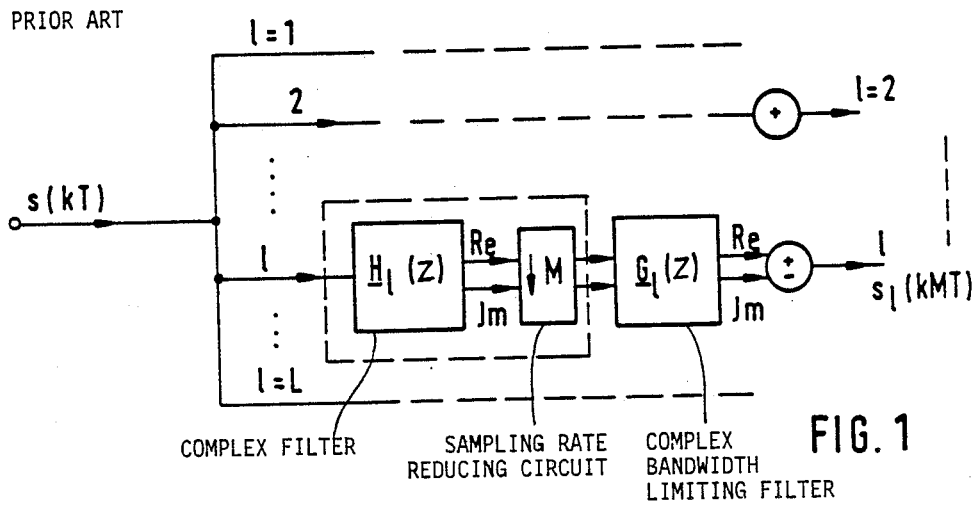
FIG. 1 is a block circuit diagram for an FDM demultiplexer according to the prior art.

FIG. 1 shows an FDM demultiplexer for L single-channel signals in which the FDM signal s(kT) is distributed to L parallel branches, is there filtered in a filter having the complex transfer function $H_l(z)$ for the $l^{th}$ individual channel whose complex output signal is sampled at a sampling rate reduced by the factor M and is fed to a complex bandwidth limiting filter $G_l(z)$ whose likewise complex output signal is linked by means of an addition/subtraction linkage circuit, for example, to again form a real value signal, the individual signal of the channel having the number l.

Figure 2:
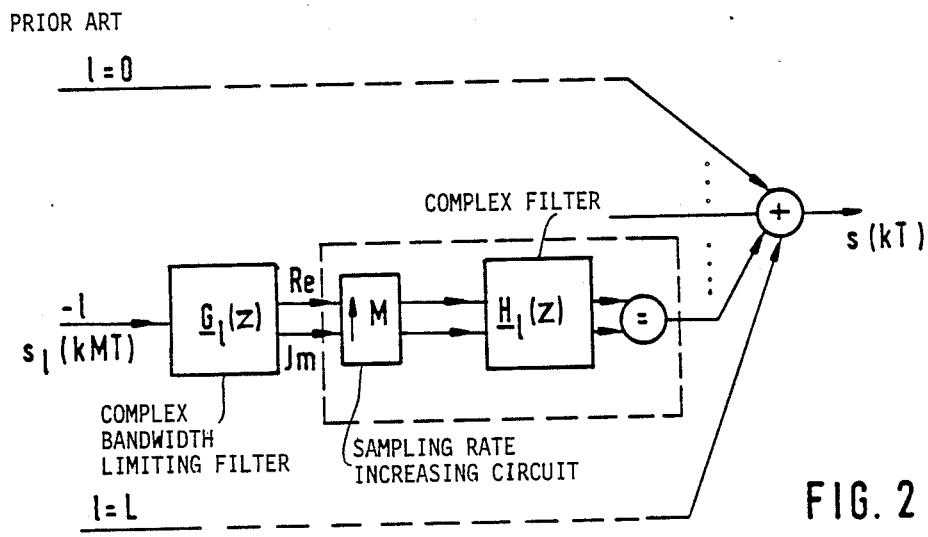
FIG. 2 is a block circuit diagram for an FDM multiplex or obtained from the demultiplexer of FIG. 1 by operation in the reverse direction.

FIG. 2 shows an FDM multiplexer obtained in a simple manner from the demultiplexer of FIG. 1 by an inverse function, i.e. by operation in the reverse direction.

Figure 3:
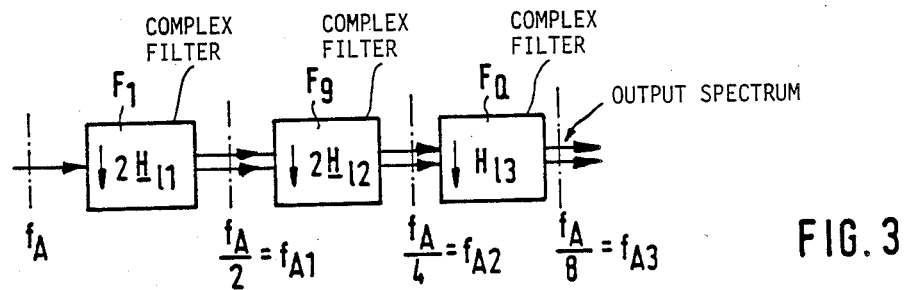
FIG. 3 is a block diagram of one embodiment of the invention.

It is an object of the present invention to replace the part of the filter framed in dashed lines by a filter cascade. The block circuit diagram of such a circuit is configured, for example, as shown in FIG. 3. Here, the cascade is composed of three stages each reducing the sampling rate by a factor of 2. The first stage forms a complex value output signal from the real value input signal and each further stage forms a complex value output signal from the complex value input signal.

Figure 4A:
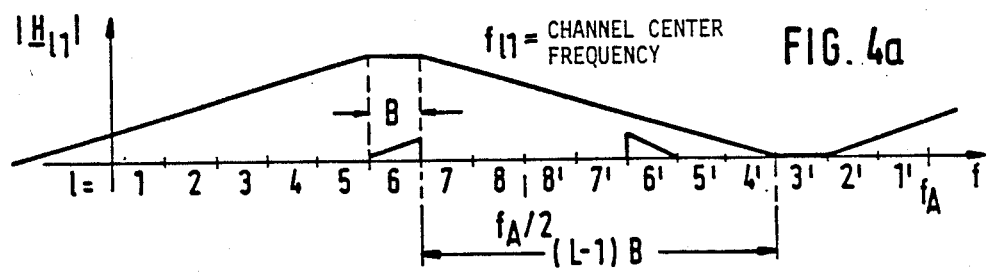
FIGS. 4a to 4d illustrate spectrums of the inputs and outputs of the circuit shown in FIG. 3.
Figure 4B:
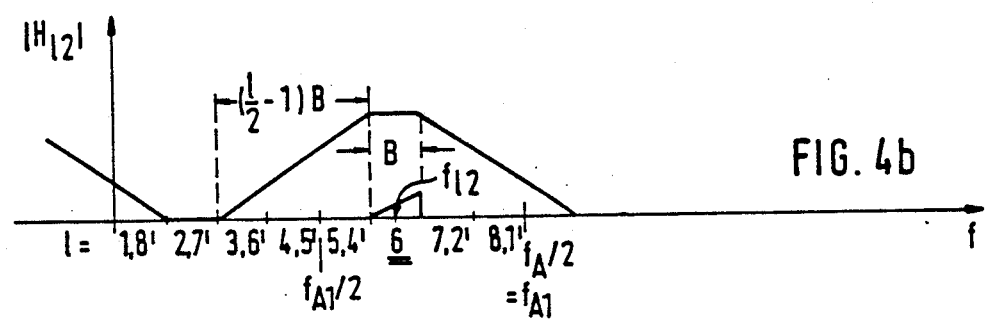
Figure 4C:
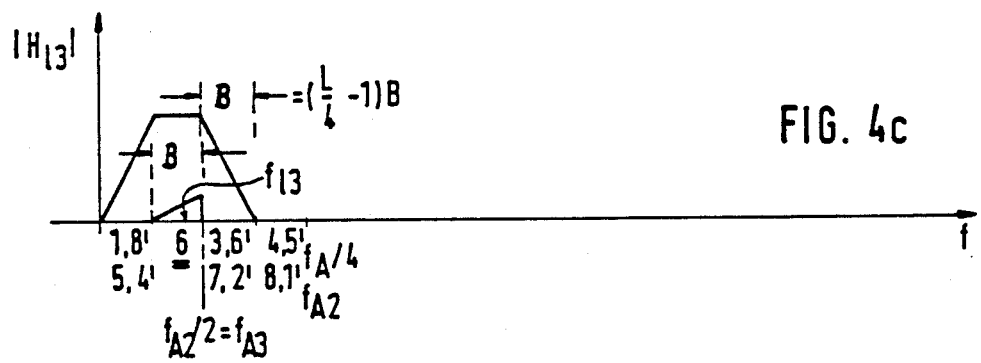

A spectral illustration of this can be seen in the diagrams of FIGS. 4a to 4d, with the illustration referring to the $6^{th}$ channel of L=8 channels and a sampling rate reduction of M=8. FIG. 4a shows the transfer function amplitude $|H_{l1}|$ of the first cascade stage plotted over the frequency f with a transmission range of a width B for a channel l=6, the center frequency $f_{l1} = (l-\frac{1}{2})B$ of this transmission range and very wide transition regions of $B \cdot (L-1) = 7B$ in each case in symmetry with the center frequency. The sampling rate $f_A$ lies at $2 \cdot L \cdot B = 16B$. FIG. 4b shows the transfer function amplitude $|H_{l2}|$ of the second cascade stage whose transmission range is likewise symmetrical to channel 1=6, but has a transmission range of (L/2−1).B symmetrically to the center frequency of channel 6: $f_{l2}=f_{l1}$. Due to the reduction in the sampling rate by a factor of 2 in the first stage, the signal spectra of channel pairs 1 and 8', 2 and 7', 3 and 6', 4 and 5', 5 and 4', 7 and 2' and 8 and 1' are each congruent, with the spectra of channels 2 and 7' falling into the blocking range of the second filter and the spectrum of channel 6 falling into the transmission range.

Due to the further reduction of the sampling rate by a factor of 2, the frequency ranges of channels 1, 8', 5 and 4' are congruent and fall into the range of the first channel, and the frequency ranges of channels 3, 6', 7 and 2' fall into the range of the third channel while the frequency of channels 4, 5' and 8 and 1' fall into the range of the fourth channel. The transfer function amplitude $|H_{l3}|$ of the third cascade stage is now configured in such a way that its transmission range of a width B falls directly into the range of the second channel into which also falls, due to the sampling rate being $f_A{}^{II}=f_A/4$, the spectrum of the sixth channel. The transition region of this third stage likewise has a width B.

It must be added that the blocking range of the first filter stage completely suppresses the spectrum of channel 3', the blocking range of the second filter stage completely suppresses the spectra 2 and 7' and the blocking range of the third stage now completely suppresses the spectra of channels 4, 5', 8 and 1'.

Figure 4D:
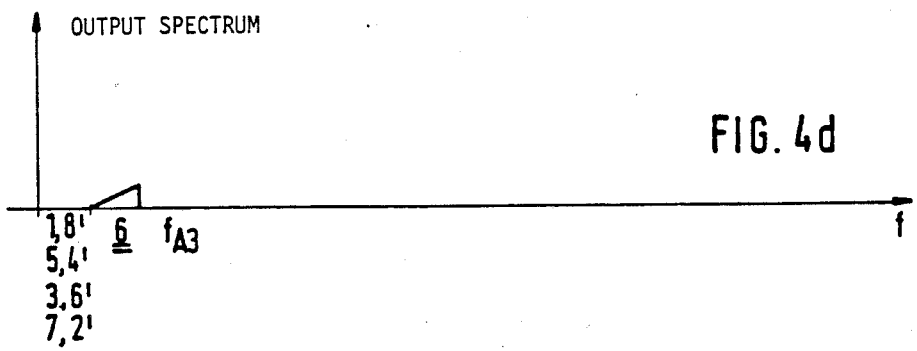

FIG. 4d now shows the output spectrum produced by again halving the sampling rate in the last stage, with the output spectrum of the sixth channel remaining in the frequency range of the second channel, but with the remaining spectra of the other channels 1, 8', 5, 4', 3, 6', 7 and 2' coming to lie in the frequency range of the first channel.

Shown here for the example of demultiplex formation for the sixth channel, the demultiplex formation for the other channels may be effected in a corresponding manner.

It will now be demonstrated how expenditures are reduced per unit time for the calculating operations in the circuit according to FIG. 3 compared to the single-stage realization of the filter transfer function $H_l(z)$ according to FIGS. 1 and 2. A prerequisite is that the individual filter stages are realized as complex value half-band filters. The real FIR half-band filter prototype is assumed to be given by the sampled values for its impulse response h(k), i.e. $k=-(n-1)/2\ldots+(n-1)/2$ and a filter length n, where $h(k)=\frac{1}{2}$ or is correspondingly scaled for k=0 and h(k)=0 for the values k=±2, ±4, etc. A generalized complex value half-band filter according to the spectral illustration of FIG. 4 results from modulation of the impulse response h(k) onto a complex carrier oscillation at a frequency corresponding to the center frequency $f_{lq}$ of the position of the desired transmission range of the $q^{th}$ filter in the cascade (q=1, ..., Q; Q=natural integer). The following then applies:

$$h_{lq}(k) = h(k)\,[\cos(2\pi k f_{lq}/f_{Aq} + \Phi 0) + j\sin(2\pi k f_{lq}/f_{Aq} + \Phi 0)]$$
$$= h_{lqr}(k) + jh_{lqi}(k),$$

where $f_{Aq}$ is the respective sampling frequency, $f_{lq}$ is the respective step-specific center frequency and $\Phi 0$ is an arbitrary zero phase. Written in a different way, the equation appears as follows:

$$h_{lq}(k) = h(k).e^{j(2\pi k f_{lq}/f_{Aq} + \Phi 0)}$$

Figure 5:
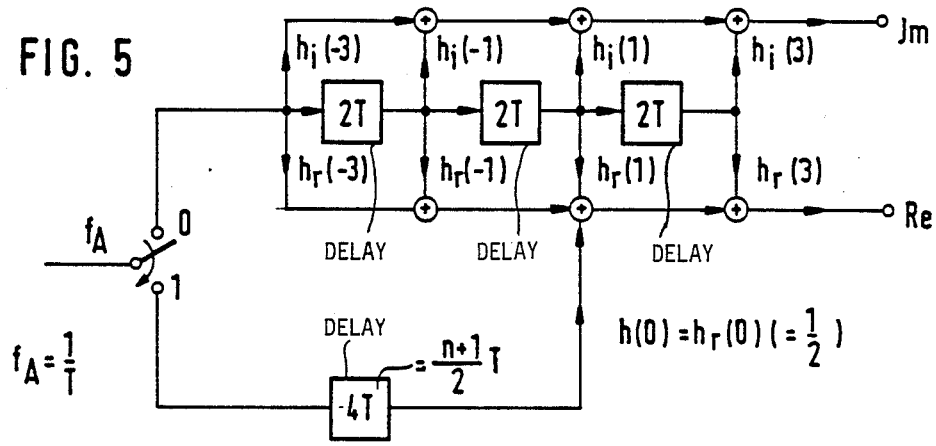
FIG. 5 is a more detailed circuit block diagram of a real input stage with a complex output signal.

FIG. 5 shows a block circuit diagram for a half-band filter with real value input and complex value output signal which can be used as the first stage in the demultiplexer of FIG. 1 or FIG. 3. (A half band filter with a real value input and output is disclosed by Bellanger et al. in IEEE Transactions on Accoustics, Speech and Signal Processing, Volume ASSP-22, No. 4, August 1974, pages 231–235).

Figure 6:
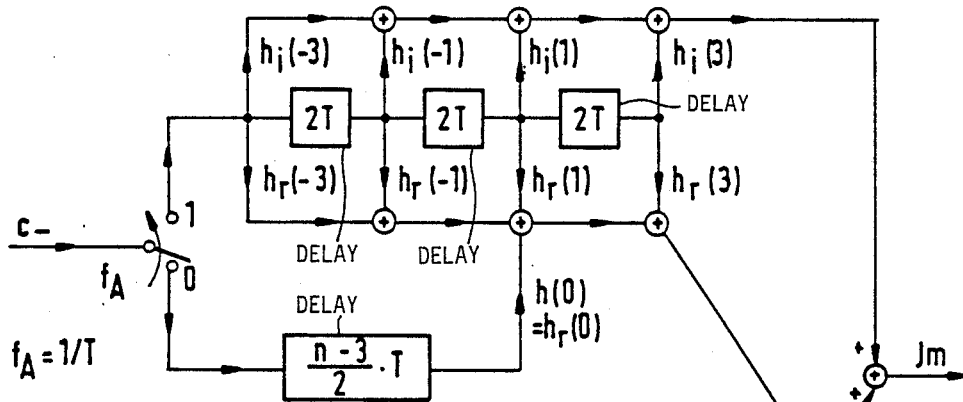
FIG. 6 shows an embodiment of a filter stage having a complex input and output signal.
Figure 6:
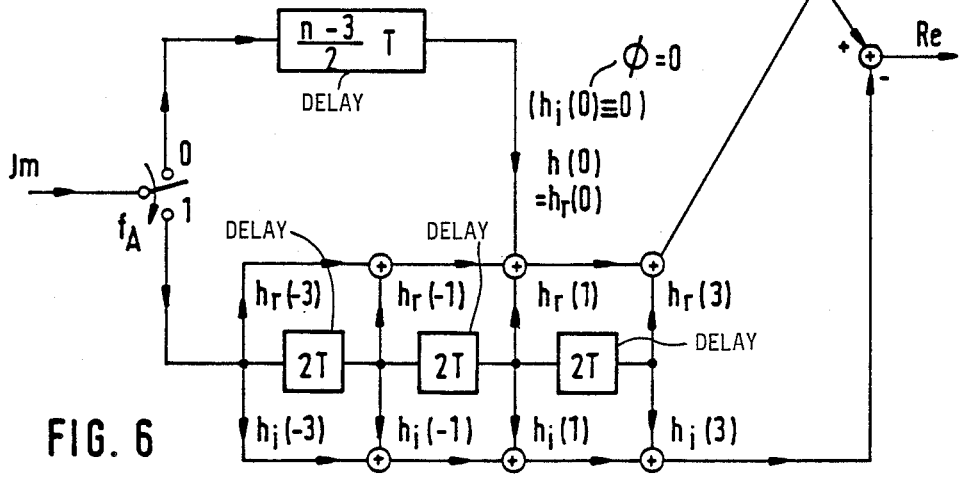

Half-band filters with real value input signals and complex value output signals or vice versa are disclosed in German Patent Application P 3,621,737 and those having complex value input and output signals are proposed in the inventor's coending U.S. application, Ser. No. 156,797, filed Feb. 17th, 1988, German Patent Application P 3,705,209, both of which are incorporated herein by reference. Both half-band filters are of the type in which the sampling rate is changed by a factor of 2, with, however, the selection of the center frequencies of the transmission range and of the blocking range being limited to only quite specific values. In contrast thereto, the center frequency of the transmission range of the present half-band filters according to FIGS. 5 and 6 is freely selectable.

The reduction of overall expenditures for the multi-stage arrangement is realized in that, in filters having a finite impulse response, the filter length n is proportional to $f_A/\Delta f$ where $f_A$ is the sampling frequency, and $\Delta f$ is the width of the transition band of the filter's transfer function from the passband to the blocking range (stopband). In the single-stage case according to the prior art, the sampling frequency $f_A \geq 2LB$; thus n=c.2L, where c is a constant. For L=8, n=c.16. For the multi-stage case q=1, 2, ... Q, $\Delta f_q = (L/2^{q-1}-1).B$, with a sampling frequency of $f_{Aq} \geq 2B.L/2^{q-1}$. $\Delta f_q$ is the width of the transition band of the $9^{th}$ filter's transfer function from the passband to blocking range (stopband). Thus, the filter length n of stage q is $n=c.2L/(L-2^{q-1})$. For L=8, the following results:

for the first stage q=1, n=c.16/7;
for stage q=2, n=c.8/3; and
for stage q=3, n=c.4.

Compared to the single-stage case of a filter length of n=c.16, the total stage length is now approximately n=c.9.

In the half-band filters according to FIGS. 5 and 6, symmetry of the coefficients can also be utilized to advantage since $h_r(-k)=-h_r(k)$ and $h_i(-k)=h_i(k)$ is true. Utilizing this symmetry of coefficients, costs can be reduced to the following extent.

Assuming that $M=64=2^6$ and the sampling frequency is $f_A{}^{VI}=f_A/64=f_A/2^6$, the single-stage filter $H_l$ according to the prior art will have a total filter length n=384 and a multiplication rate $M_E=n.f_A{}^{VI}=384.f_A{}^{VI}$ as well as an addition rate $A_E=2(n-1).f_A{}^{VI}=766f_A{}^{VI}$.

In a six-stage solution employing a sampling rate reduction factor of $M_q=2$ for all Q stages, a filter length of $n_q=3$ results for the filters of stages 1 to 3, a filter length of $n_q=7$ for stages 4 and 5 and a filter length of $n_q=11$ for stage 6. The multiplication rates are calculated as follows:

$$M_M = 1/2 \cdot (n_1 + 3) f_{A1} + \sum_{q=2}^{6} (n_q + 3) \cdot f_{Aq}$$

$$= [3 \cdot 32 + 6(16 + 8) + 10(4 + 2) + 14] f_{A6}$$

$$= 314 \cdot f_{A6}.$$

The addition rate Am results as follows:

$$A_M = n_1 \cdot f_{A1} + 2 \cdot \sum_{q=2}^{6} (n_q + 1) \cdot f_{Aq}$$

$$= [3 \cdot 32 + 8(16 + 8) + 16(4 + 2) + 24] \cdot f_{A6}$$

$$= 408 \cdot f_{A6}.$$

In this way, sometimes considerable improvements result for the total filter length as well as for the multiplication and addition rates. Moreover, because of the small filter length $n_q$, the required coefficients and signal word lengths in the multi-stage solutions according to the invention are smaller than in the single-stage solution, thus resulting in a further advantage with respect to expenditures.

The present disclosure relates to the subject matter disclosed in the Federal Republic of Germany, P 37 16 018.4 on May 14th, 1987, the entire specification of which is incorporated herein by reference.

It will be understood that the above description of the present invention is susceptible to various modifications, changes and adaptations, and the same are intended to be comprehended within the meaning and range of equivalents of the appended claims.

What is claimed is:

1. A filter bank for frequency demultiplexing of a number of channel signals, comprising a plurality of first nonrecursive filters, one for each channel, having complex value coefficients, each of said first nonrecursive filters having means for providing complex value output signals from real value input signals, such that the sampling rate at the output is reduced from that at the input by a given factor greater than 1, which can be designated as M; at least one of said first nonrecursive filters comprising a composite filter formed of a cascade of Q second nonrecursive filters including an input nonrecursive filter, Q being a positive integer greater than 1, each of said second nonrecursive filters having a complex value coefficient and successive ones of said second nonrecursive filters having means for reducing the sampling rate by respective factors of $M_q > 1$, $q=1$ to Q, wherein $$\prod_{q=1}^{Q} M_q = M,$$

said input nonrecursive filter having means for receiving a real value input signal and outputting a complex value output signal, all of said second nonrecursive filters except said input nonrecursive filter having means for receiving a complex value input signal and outputting a complex value output signal.

2. A filter bank as in claim 1, wherein the respective factors $M_q$ are such that the output signal of one of the second nonrecursive filters of said composite filter has a sampling rate which is decreased by a factor $2^i$ relative to the sampling rate of the input of another one of said second nonrecursive filters, where i is a postive integer.

3. A filter bank as in claim 1, wherein the product of a given plurality of the factors $M_q$ is equal to $2^i$, where i is a positive integer.

4. A filter block as in claim 3, wherein the factors $M_q$ in the given plural number of factors $M_q$ are equal to 2, the given plural number is equal to the positive integer i, and the factors $M_q$ of the given plural number of factors $M_q$ correspond to an equal number i of the second nonrecursive filters connected in cascade.

5. A filter block as in claim 4 wherein said equal number of the second nonrecursive filters in cascade are complex half-band filters.

6. A filter block as in claim 1, wherein each of said first nonrecursive filters comprises a transversal filter.

7. A filter block as in claim 1, wherein each of said first nonrecursive filters has an impulse response of finite duration.

8. A filter bank for frequency multiplexing of a number of channel signals, comprising a plurality of first nonrecursive filters, one for each channel, having complex value coefficients, each of said first nonrecursive filters having means for providing real value output signals from complex value input signals, such that the sampling rate at the output of each of said first filters is increased from that at the input of each of said first filters by a given factor greater than 1, which can be designated as M; at least one of said first filters comprising a composite filter formed of a cascade of Q second nonrecursive filters including an output nonrecursive filter, Q being a positive integer greater than 1, each of said second nonrecursive filters having a complex value coefficient, successive ones of said second nonrecursive filters having means for increasing the sampling rate by respective factors of $M_q > 1$, $q=1$ to Q, wherein $$\prod_{q=1}^{Q} M_q = M,$$

said output nonrecursive filter having means for receiving as an input signal a complex output signal from a last of the remaining Q-1 of said second nonrecursive filters, and outputting a real value output signal, all of said Q-1 remaining second nonrecursive filters having means for receiving a complex value input signal and outputting a complex value output signal.

9. A filter bank as in claim 8, wherein the respective factors $M_q$ are such that the output signal of one of the second nonrecursive filters of said composite filter has a sampling rate which is increased by a factor $2^i$ relative to the sampling rate of the input of another one of said second nonrecursive filters, where i is a positive integer.

10. A filter bank as in claim 8, wherein the product of a given plurality of the factors $M_q$ is equal $2^i$, where i is a positive integer.

11. A filter block as in claim 10, wherein the factors $M_q$ in the given plural number of factors $M_q$ are equal to 2, the given plural number is equal to the positive integer i, and factors $M_q$ of the given plural number of factors $M_q$ correspond to an equal number i of the second nonrecursive filters connected in cascade.

12. A filter block as in claim 11, wherein said equal number of the second nonrecursive filters in cascade are complex half-band filters.

13. A filter block as in claim 9, wherein each of said first nonrecursive filters comprises a transversal filter.

14. A filter block as in claim 9, wherein each of said first nonrecursive filters has an impulse response of finite duration.

* * * * *